United States Patent [19]
Nozaki et al.

[11] Patent Number: 6,027,856
[45] Date of Patent: Feb. 22, 2000

[54] NEGATIVE-TYPE RESIST COMPOSITION AND PROCESS FOR FORMING RESIST PATTERNS

[75] Inventors: Koji Nozaki; Ei Yano, both of Kawasaki, Japan

[73] Assignee: Fujitsu Limited, Kawasaki, Japan

[21] Appl. No.: 09/272,400

[22] Filed: Mar. 19, 1999

[30] Foreign Application Priority Data

Apr. 28, 1998 [JP] Japan .................................. 10-119385

[51] Int. Cl.$^7$ .................................................. G03C 1/725
[52] U.S. Cl. ........................................ 430/281.1; 430/325
[58] Field of Search ................................. 430/325, 281.1

[56] References Cited

U.S. PATENT DOCUMENTS 5,621,019   4/1997   Nakano et al. ............................ 522/49

FOREIGN PATENT DOCUMENTS

| | | |
|---|---|---|
| 4-39665 | 2/1992 | Japan . |
| 5-346668 | 12/1993 | Japan . |
| 7-181677 | 7/1995 | Japan . |
| 9-73173 | 3/1997 | Japan . |
| 9-90637 | 4/1997 | Japan . |

OTHER PUBLICATIONS

Y. Kaimoto et al., Alicyclic Polymer for ArF and KrF Excimer Resist Based on Chemical Amplification, Advances in Resist Technology and Processing IX, SPIE vol. 1672, 1992, pp. 66–73.

S. Takechi et al., Alicyclic Polymer for ArF and KrF Excimer Resist Based on Chemical Amplification, *Journal of Photopolymer Science and Technology*, vol. 5, No. 3, 1992, pp. 439–446.

K. Maeda et al., Novel Alkaline–Soluble Alicyclic Polymer Poly(TCDMACOOH) for ArF Chemically Amplified Positive Resists, SPIE vol. 2724, Jun. 1996, pp. 377–385.

K. Nozaki et al., Molecular Design and Synthesis of 3–Oxocyclohexyl Methacrylate for ArF and KrF Exicimer Laser Resist, *American Chemical Society*, 1994, pp. 1492–1498.

M. Takahashi et al., Evaluation of chemically amplified resist based on adamantyl methacrylate for 193 nm lithography, SPIE vol. 2438, pp. 422–432.

K. Nozaki et al., A New Single–Layer Resist for 193–nm Lithography, *Jpn. J. Appl. Phys.*, vol. 35, Part 2, No. 4B, Apr. 15, 1996.

S. Takechi et al., Impact of 2–Methyl–2–Adamantyl Group Used for 193–nm Single–Layer Resist, *Journal of Photopolymer Science and Technology*, vol. 9, No. 3, 1996, pp. 475–488.

K. Nozaka et al., A Novel Polymer For a 193–nm Resist, *Journal of Photopolymer Science and Technology*, vol. 9, No. 3, 1996, pp. 509–522.

K. Nozaki et al., New Protective Groups in Alicyclic Methacrylate Polymers for 193–nm Resists, *Journal of Photopolymer Science and Technology*, vol. 10, No. 4, 1997, pp. 545–550.

Y. Tsuchiya et al., Investigation of Acid–Catalyzed Insolubilization Reactions for Alicyclic Polymers with Carboxyl Groups, *Journal of Photopolymer Science and Technology*, vol. 10, No. 4, 1997, pp. 579–584.

*Primary Examiner*—Janet Baxter
*Assistant Examiner*—Rosemary Ashton
*Attorney, Agent, or Firm*—Armstrong, Westerman, Hattori, McLeland and Naughton

[57] ABSTRACT

A negative-type resist composition which is developable in a basic aqueous solution, which comprises a film-formable, basic aqueous solution-soluble polymer with an alkali-soluble group, a compound with an allyl alcohol structure and a photoacid generator which when decomposed by absorption of image-forming radiation causes the compound with an allyl alcohol structure to become a protecting group for the alkali-soluble group, as well as a resist pattern-forming process which employs it. A basic aqueous solution can be used as the developing solution, and it is possible to form intricate patterns with a practical sensitivity and no swelling.

13 Claims, No Drawings

NEGATIVE-TYPE RESIST COMPOSITION AND PROCESS FOR FORMING RESIST PATTERNS

BACKGROUND OF THE INVENTION

1. Field of the Invention

The present invention relates to a negative-type resist composition which can be developed with a basic aqueous solution, and to a pattern-forming process. In recent years, greater integration of semiconductor integrated circuits has led to the realization of LSI and VLSI circuits, and the minimum line width of wiring patterns has reached the sub half-micron dimensions. This has required establishment of microfabricating techniques, and in the field of lithography this demand has been met with a solution whereby the wavelength of ultraviolet rays from the exposure light source is shifted toward the shorter wavelengths of the deep ultraviolet region, while much research has also been devoted to exposure methods employing light sources with wavelengths in the far ultraviolet region. At the same time, there has been accelerated development of resist materials which have lower light absorbance at shorter wavelengths and which have satisfactory sensitivity as well as high dry etching resistance.

2. Description of the Related Art

Recent years have seen more research into photolithography employing krypton fluoride excimer lasers (wavelength: 248 nm, hereunder abbreviated to KrF) as new exposure light sources for semiconductor fabrication, and these are beginning to come into practical use. Resists with high sensitivity and high resolution which can meet the short wavelength light sources include resist compositions based on the concept of "chemical amplification", which have been introduced by H. Ito et al. of IBM, U.S. (J. M. J. Frechet et al., Proc. Microcircuit Eng., 260 (1982), H. Ito et al., Digest of Technical Papers of 1982 Symposium on VLSI Technology, 86 (1983), H. Ito et al., "Polymers in Electronics", ACS Symposium Series 242, T. Davidson, ed., ACS, 11 (1984), U.S. Pat. No. 4,491,628 (1985)). The fundamental concept is based on utilizing a catalytic reaction in the resist film to improve the apparent quantum yield for higher sensitivity and resolution.

Referring to the example of a chemical amplification positive resist obtained by adding a PAG (Photo Acid Generator), which produces acid by light, to t-butoxycarbonylated (t-BOC) polyvinyl phenol (PVP), which has been very widely studied and utilized, post exposure baking (PEB) at the exposed sections of the resist causes the deprotection of the t-BOC protective groups, resulting in isobutene and carbon dioxide. The protonic acid generated in the deprotection reaction acts as a catalyst promoting a deprotecting chain reaction, thus resulting in considerable change in the polarity of the exposed regions. Accordingly, a resist pattern can be formed by selecting an appropriate developer.

Research has also been accelerating in recent years on lithography employing ArF (argon fluoride) excimer lasers at an even shorter wavelength (wavelength: 193 nm) for fabrication of devices with high monolayer integration, such as gigabit class DRAMs. At this wavelength the light absorption is stronger in conventional phenolic resins, and therefore the base resins must be changed. There has thus been an urgent need for development of resists which are suitable for such shorter wavelengths.

While much research has been conducted on conventional positive-type chemical amplification resists which are suitable for the ArF wavelength (for example, K. Nozaki et al., Chem. Mater., 6, 1492 (1994), K. Nakano et al., Proc. SPIE, 2195, 194 (1994), R. D. Allen et al., Proc. SPIE, 2438, 474 (1994), Japanese Unexamined Patent Publication No. 9-90637 and K. Nozaki et al., Jpn. J. Appl. Phys., 35, L528 (1996), K. Nozaki et al., J. Photopolym. Sci. Technol., 10(4), 545–550 (1997)), there have been few reports of monolayer negative-type chemical amplification resists, and even those have only been resists which include a crosslinker in the resist composition to obtain crosslinked negative patterns (for example, A. Katsuyama et al., Abstracted Papers of Third International Symposium on 193 nm Lithography, 51 (1997), Maeda et al., Extended Abstracts, the 58th Symposium on Applied Physics, No.2, 647(3a-SC-17) (1997)). Such negative resists take advantage of crosslinking reaction at the exposed region to increase the molecular weight, thus producing a difference in solubility in the developing solution with respect to the unexposed region, to obtain negative patterns. The issue of pattern swelling therefore is inevitable which limits to fabricate precise micropatterns.

Resolution enhancement techniques have been widely researched in recent years which employs phase shifting masks instead of binary masks, and this is a promising technique to obtain resolutions below exposure wavelengths. Negative-type resists are considered to be suitable when such masks are used, and thus ArF negative-type resists are also strongly desired from this standpoint as well. Such masks are considered applicable in cases which require resolution of 0.13 µm or less with ArF light sources, and therefore efforts have been accelerating at developing resists which can resolve such micropatterns without swelling.

SUMMARY OF THE INVENTION

It is an object of the invention to overcome the aforementioned problems of the prior art by providing a novel negative-type resist composition which employs a basic aqueous solution as the developing solution, has a practical level of sensitivity, and which can form micropatterns without swelling.

It is a further object of the invention to provide a novel resist composition with excellent dry etching resistance with acceptable transparency of the resist films at KrF and ArF wavelength.

It is a still further object of the invention to provide a novel resist composition capable of forming micropatterns, wherein the difference in polarity is produced upon exposure between the exposed regions and unexposed regions to provide high sensitivity, high contrast and high resolution.

It is a still further object of the invention to provide a process for forming resist patterns using such a resist composition.

As a result of diligent research aimed at solving the problems described above, the present inventors have learned that for chemical amplification resist compositions it is important to use a polymer as the base resin which is a polymer with an alkali-soluble group, which is film-formable and which is soluble in basic aqueous solutions, and to also use a compound with an allyl alcohol structure.

The present invention relates to a negative-type resist composition which is developable in a basic aqueous solution, which comprises a film-formable, basic aqueous solution-soluble polymer with an alkali-soluble group, a compound with an allyl alcohol structure and a photoacid generator which can generate an acid upon decomposition by absorption of image-forming radiation such that the compound with an allyl alcohol structure can protect the alkali-soluble group.

According to another aspect of the invention there is provided a process for forming resist patterns, characterized by being a process for forming resist patterns comprising the following steps of:

coating a target substrate with a resist composition of the invention, selectively exposing the formed resist film to image-forming radiation capable of inducing decomposition of the photoacid generator in the resist composition, and developing the exposed resist film with a basic aqueous solution.

DESCRIPTION OF THE PREFERRED EMBODIMENTS

The compound with an allyl alcohol structure may include a structure represented by the following formula (I) or (II).

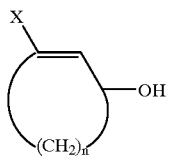

(I)

wherein X represents a hydrogen atom or a linear, branched or cyclic alkyl group which may itself have an additional allyl alcohol structure, and n represents an integer of 2–7;

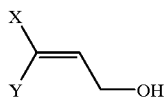

(II)

wherein X is as defined above, and Y represents a linear, branched or cyclic alkyl group with at least two carbon atoms, which may itself have an additional allyl alcohol structure, and which may also have another substituent.

The term "alkali-soluble polymer" referring to the base resin employed in the resist composition of the invention is used in a wide sense, and encompasses different polymer types ranging from homopolymers composed of single monomer units to copolymers including those monomer units with other desired monomer units (including terpolymers, etc.).

The polymer used here is preferably an alkali-soluble one wherein at least one of the structural monomer units is a (meth)acrylate-based monomer unit, i.e. an acrylate-based or methacrylate-based monomer unit, a vinyl phenolic monomer unit, an N-substituted maleimide-based monomer unit, a styrene-based monomer unit or a monomer unit with a polycyclic alicyclic hydrocarbon substituent, and more preferably a monomer unit with a structure typified by an adamantyl group, norbornyl group, etc. in the polycyclic alicyclic hydrocarbon portion.

The resist composition of the invention is preferably one with absorbance of 1.75 or lower at the exposure light wavelength (180–300 nm), for adequate patterning characteristics.

When the alkali-soluble polymer is in the form of a copolymer, the other monomer unit in combination with the monomer unit with the alkali-soluble group may have any structure so long as the polymer can maintain suitable alkali solubility in the developing solution. Even in cases where the alkali-soluble polymer is in the form of a terpolymer there is no restriction so long as the polymer retains its alkali solubility, and such combinations are also preferred. In such cases, the first monomer unit with an alkali-soluble group may be used with an additional second monomer unit with a weak alkali-soluble group, and such combinations are also preferred.

The resist composition of the invention is preferably provided in the form of a solution in a solvent selected from the group consisting of ethyl lactate, methyl amyl ketone, methyl-3-methoxypropionate, ethyl-3-ethoxypropionate, propylene glycol methyl ether acetate and mixtures thereof. The resist solution may also contain, if necessary, an auxiliary solvent selected from the group consisting of butyl acetate, γ-butyrolactone, propylene glycol methyl ether and mixtures thereof.

In the process for forming resist patterns according to the invention, the resist film which has been formed on the target substrate is preferably subjected to heat treatment before and after being subjected to the selective exposure step. That is, according to the invention, the resist film is subjected to pre-baking treatment before exposure, and is also subjected to post baking treatment explained above as PEB (post exposure baking) after the exposure and before development. This heat treatment can be advantageously accomplished by conventional methods.

The proportion of monomer units in the alkali-soluble polymer of the invention which have alkali-soluble groups need not be specified so long as the resin itself exhibits sufficient alkali solubility, but in order to obtain a suitable alkali dissolution rate (dissolution rate of 100 Å/s–10,000 Å/s in a 2.38% TMAH developing solution) considered to be practical for negative resists, it is recommended, for example in the case of a polymer comprising two or more monomer components, for the content of monomer units with alkali-soluble groups to be preferably 10–90 mol %, and more preferably 30–70 mol %. If the content of such monomer units is less than 10 mol % the alkali solubility will be inadequate making it impossible to achieve satisfactory patterning, while if it is over 90 mol % the alkali solubility will be too high, resulting in an excessively high dissolution rate in the basic aqueous solution and making it impossible to achieve patterning by polarity alteration. It is more preferred for the content of such monomer units to be 30–50 mol %.

The content of the compound with an allyl alcohol structure will depend on the number of alkali-soluble groups in the polymer, i.e. on the alkali dissolution rate, but for polymers with a suitable alkali dissolution rate as mentioned above the recommended amount of addition is 1–80 wt % (with respect to the polymer weight). A more preferred recommendation is 10–40 wt %.

The content of the photoacid generator (PAG) will depend on the strength of the acid generated upon exposure to the light source, but it is normally recommended to be 0.1–50 wt % (with respect to the polymer weight), and a more preferred recommendation is 1–15 wt %. The weight average molecular weight of the polymer used for the invention is recommended to be in the range of 2000–1,000,000, and a more preferred recommendation is a range of 3000–50,000.

The solvent added to the resist solution may not be necessary depending on the solubility of the solutes, but for solutes with low solubility it is usually preferred to be added at 1–30 wt % with respect to the main solvent, with a more preferred recommendation being 10–20%.

The basic aqueous solution used as the developing solution may be an aqueous solution of a hydroxide of a metal belonging to Group I or II in the periodic table, such as potassium hydroxide, or an aqueous solution of an organic base containing no metal ion, such as tetraalkylammonium hydroxide; an aqueous solution of tetramethylammonium hydroxide (TMAH) is most preferred, and various additives such as surfactants may also be added for an enhanced developing effect.

As will become readily apparent by the detailed description which follows, the resist composition and the resist pattern forming process of the present invention may be accomplished by a number of different preferred embodiments.

The invention relates to a chemically amplified resist composition which can be developed by a basic aqueous solution to form negative resist patterns on target substrates. The resist composition comprises (a) a film-forming polymer containing an alkali-soluble group, which is itself soluble in basic aqueous solutions, (b) a compound with an allyl alcohol structure and (c) a PAG (photoacid generator) which decomposes upon irradiation and is capable of generating an acid which can cause the protection of the alkali-soluble group with the allyl alcohol compound, wherein the compound having the allyl alcohol structure has a structure represented by formula (I) or (II) above. The mechanism behind the chemical amplification of the resist composition of the invention is as follows.

This explanation will deal with a case in which a carboxylic acid is used as the alkali-soluble part of the alkali-soluble polymer, and a compound of formula (I) is used as the compound with an allyl alcohol structure. When the PAG in the resist composition is exposed to image-forming radiation after the resist film has been formed, it absorbs the radiation and generates an acid. When the exposed resist film is then heated, the acid which was produced acts catalytically to promote the following esterification reaction at the exposed regions of the film to reduce the alkali solubility of the polymer.

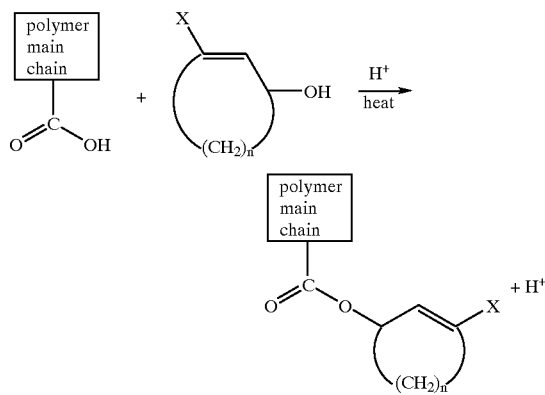

In the resist composition according to the invention, an alkali-soluble group is included in the base resin, and there is also included a compound with an allyl alcohol structure represented by formula (I) or (II), which can protect the alkali-soluble group upon heating in the presence of the acid catalyst. Because it is an amplification type whereby the proton acid is regenerated by the protecting reaction, a high sensitivity can be achieved. When the alkali solubility is lost (ester conversion in the above formula) after the reactive group has been protected, the exposed regions of the resist film become alkali-insoluble, thus forming a negative pattern after development with a basic aqueous solution. According to the invention, patterns with no swelling can be obtained because the patterns are formed using changes in polarity produced in the resist.

The alkali-soluble polymer used as the base resin in the resist composition of the invention, especially when in the form of a terpolymer, has a strong alkali-soluble group, of which carboxylic acid is typical, in the first monomer unit, while the second monomer unit has a weak alkali-soluble group with a lactone ring structure, acid anhydride, imide ring structure, etc. In such cases, the contents of the strong alkali-soluble group and weak alkali-soluble group may be controlled to easily adjust the alkali dissolution rate of the base resin to the desired value. The third monomer unit may be one with a functional group which has resistance to etching, and it is strongly required for resists.

The structure of the alkali-soluble polymer used as the base resin in the resist composition of the invention is not particularly restricted so long as it satisfies the conditions given above, particularly the condition of having a suitable alkali dissolution rate, but if achieving dry etching resistance comparable to novolac resins is a consideration, it is recommended to use polymers with acrylate-based monomer units or methacrylate-based monomer units, vinyl phenolic polymers, N-substituted maleimide-based polymers styrene-based polymers, etc., which have polycyclic alicyclic hydrocarbon compounds in the ester groups. In particular, acrylate-based and methacrylate-based polymers are important because they have low absorption of light when using deep ultraviolet rays, especially at a wavelength of 250 nm or less, as the exposure light source. In other words, when deep ultraviolet rays are used as the exposure light source, it is preferred to use polymers with structures including no aromatic rings which strongly absorb light in the deep ultraviolet region, or chromophores having high extinction coefficient, such as conjugated double bonds.

In particular, when using light sources with light exposure wavelengths in the extremely short wavelength region, such as ArF excimer laser, dry etching resistance and transparency at such wavelengths (193 nm) become necessary properties, and therefore it is recommended to use polymers with ester groups including polycyclic alicyclic hydrocarbon structures typified by the aforementioned adamantyl groups, norbornyl groups, etc. which have high dry etching resistance, and especially acrylate-based and methacrylate-based polymers.

The molecular weight (weight average molecular weight Mw) of the aforementioned acrylate- or methacrylate-based polymer, or other alkali-soluble polymer may be varied within a wide range, but it is preferably in the range of 2,000 to 1,000,000, and more preferably 3,000 to 50,000.

Alkali-soluble polymers which can be advantageously used for carrying out the invention include, but are not restricted to, the following exemplary polymers. In the following formulae, l, m and n represent the numbers of monomer units (repeating units) necessary to obtain the aforementioned weight average molecular weight, and unless otherwise specified $R_1$ to $R_3$ represent any desired substituent, for example, a hydrogen atom, halogen atom (chlorine, bromine, etc.), lower alkyl group (methyl group, ethyl group, etc.), cyano group or the like, and they may be all the same or different.

(1) Acrylate- and methacrylate-based polymers

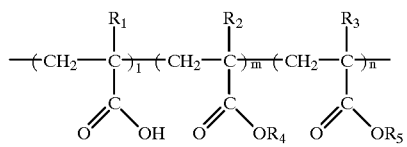

In this structural formula, $R_4$ represents a weak alkali-soluble group, a representative example of which is a lactone ring, but a monomer unit including it is not a necessary unit so long as the alkali dissolution rate is a value suitable as a negative resist base resin. $R_5$ may be any desired neutral functional group, and it may be appropriately selected in consideration of the transparency at the exposure wavelength and etching resistance. For improved adhesion of the resist to the substrates, it may also include a neutral group such as a ketone or hydroxyl group.

In addition, the following compounds with a structure including an ester group that has a carboxylic acid group as the alkali-soluble group are of course acceptable.

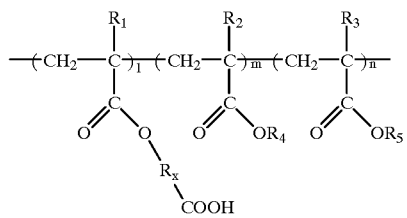

In this structural formula, $R_4$ and $R_5$ have the same definitions given above. $R_x$ may have any desired structure, but it is preferably selected similarly to $R_5$.

(2) The following polymers including a styrene-based unit as the alkali-soluble unit.

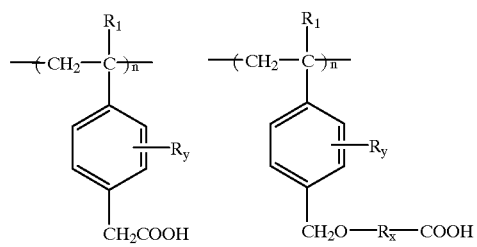

In this structural formula, $R_y$ represents any desired substituent. $R_x$ is preferably selected as described above.

(3) The following polymer including a fumaric acid-based unit as the alkali-soluble group.

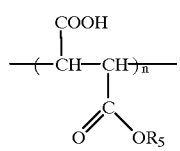

(4) The following polymer including a vinyl benzoic acid-based unit as the alkali-soluble group.

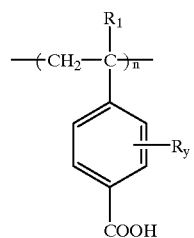

In this structural formula, $R_y$ is the same as above.

(5) The following polymer including a norbornene carboxylic acid-based unit as the alkali-soluble group.

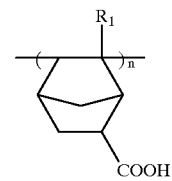

(6) The following polymers including an itaconic acid-based unit as the alkali-soluble group.

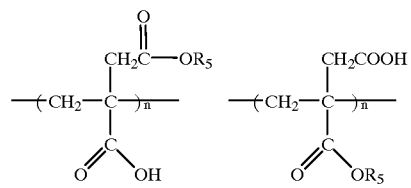

(7) The following polymer including a maleic acid-based unit as the alkali-soluble group.

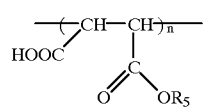

(8) The following polymer including a vinyl phenole-based unit as the alkali-soluble group.

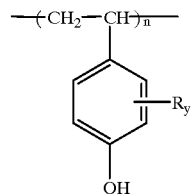

As explained above, these polymers may also be combined with other appropriate monomer units to compose any desired copolymers (including 3 or more components).

More specific examples of the alkali-soluble polymers which can be used according to the invention are those represented by the following formulas (III)–(XV).

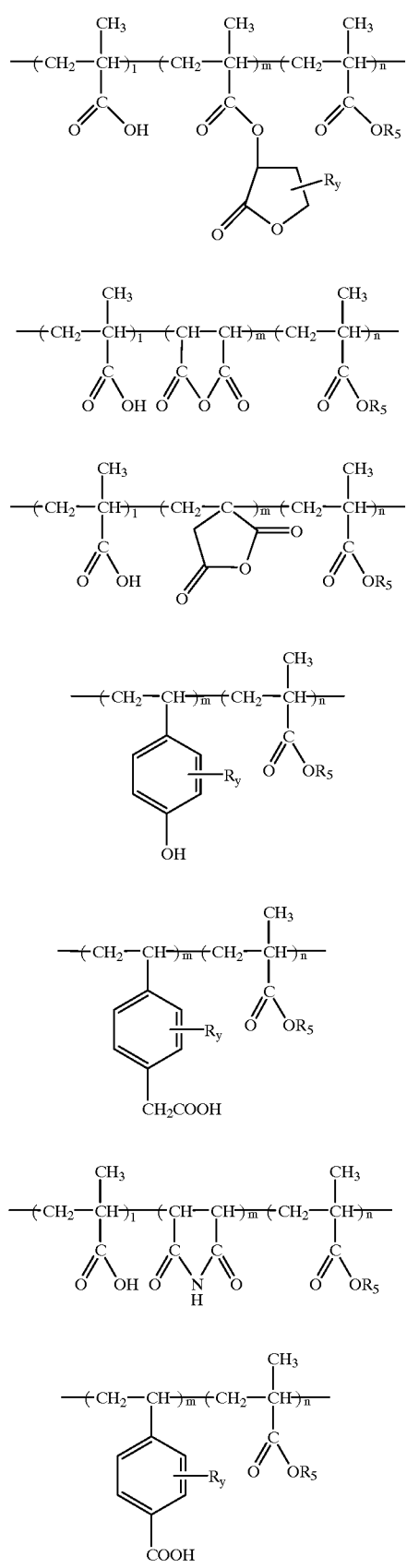
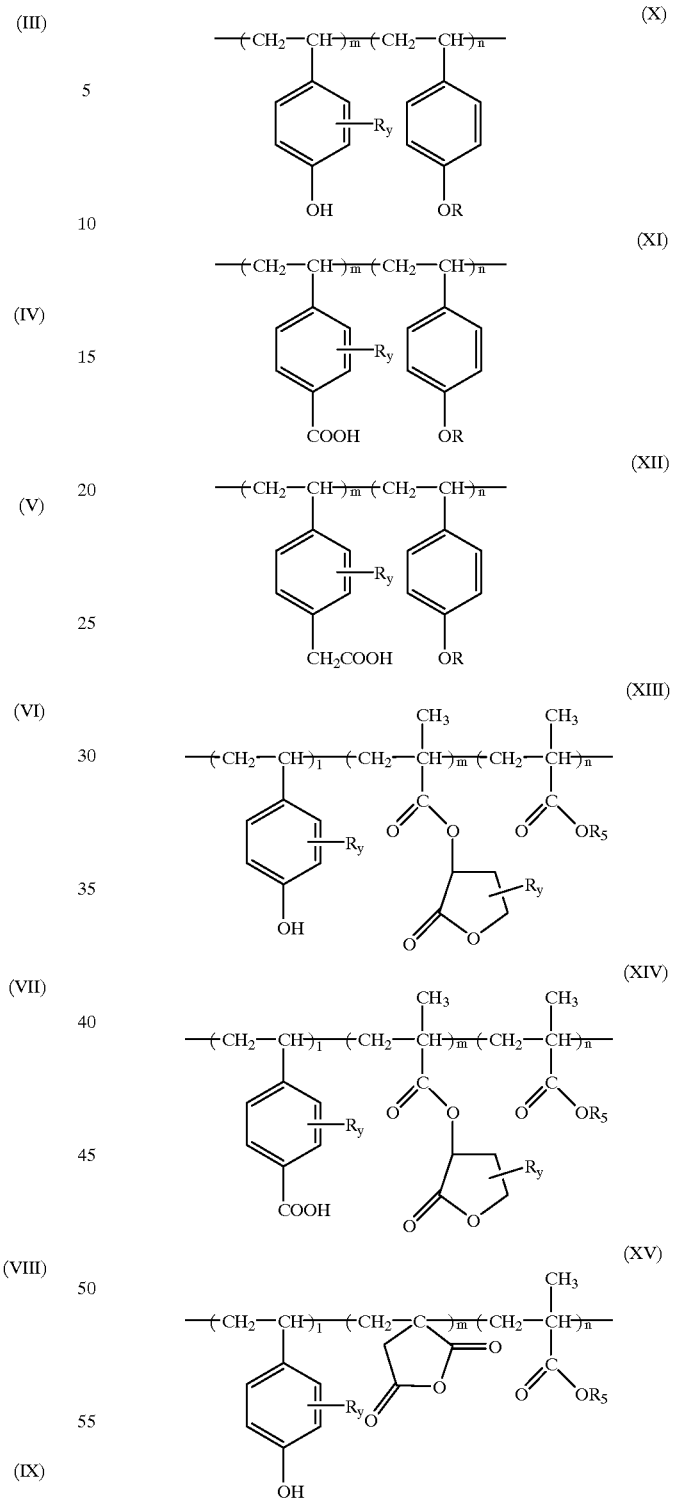

These are only examples and their structures are not intended to be restrictive. Also, $R_y$ and $R_5$ in these formulas are as defined above and R is any desired functional group selected similarly to $R_5$, while compounds with structures not dissociated with acid are preferred for the construction of the resist. The following compounds have structures as typical functional groups which can be advantageously used for $R_5$ in these structural formulas.

(1) Adamantyl-based compounds

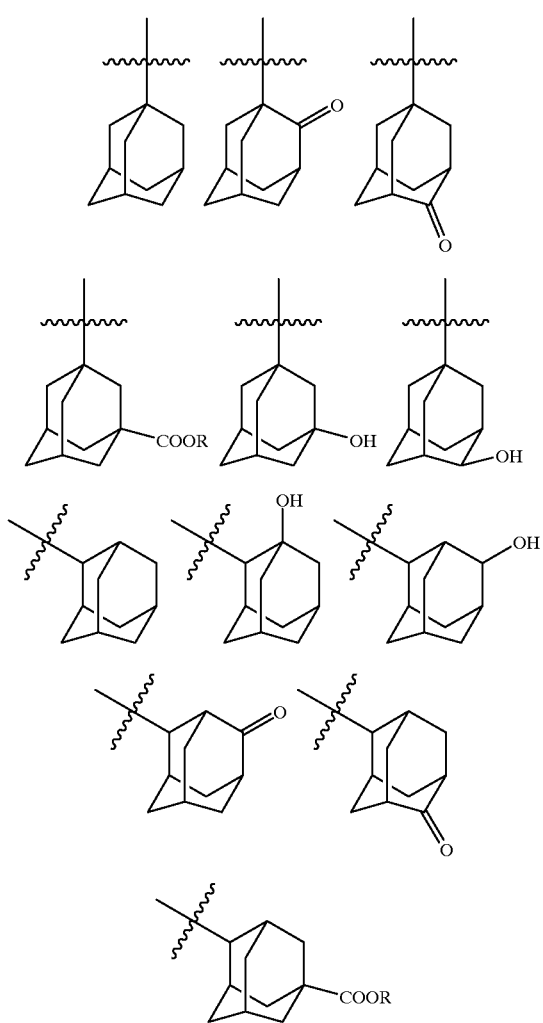

(2) Norbornane compounds

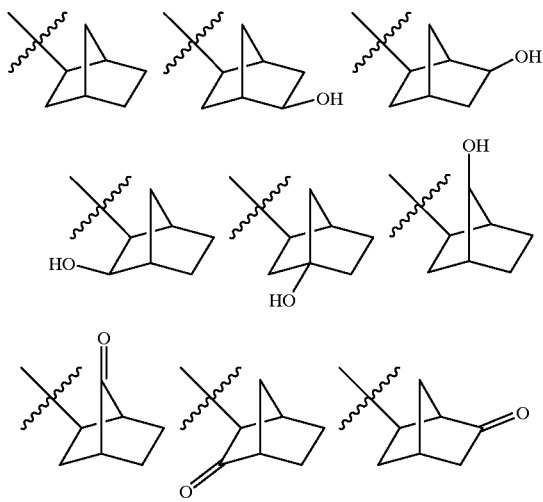

-continued

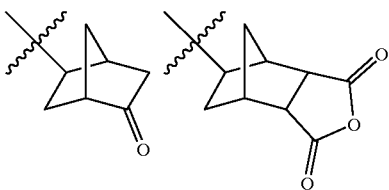

(3) Dicyclopentadiene-based compounds ($R_z$ represents a hydroxyl, ketone or alkoxycarbonyl group.)

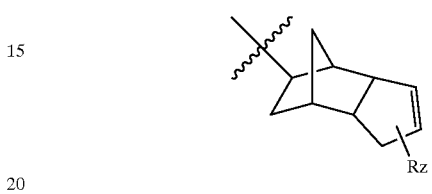

Formulas (I) and (II) above were given as allyl alcohol-based compounds to be added to the base resin, but more specific examples of compounds which can be advantageously used include the following.

(1) Cyclic allyl alcohols

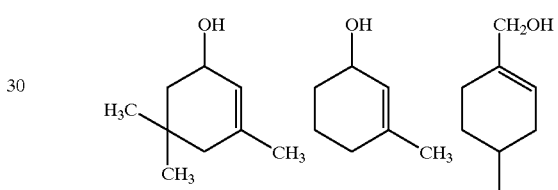

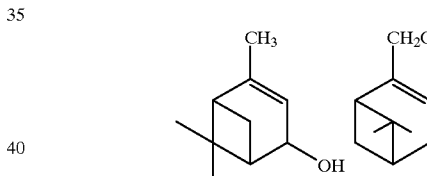

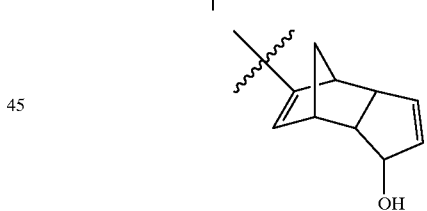

(2) Linear allyl alcohols

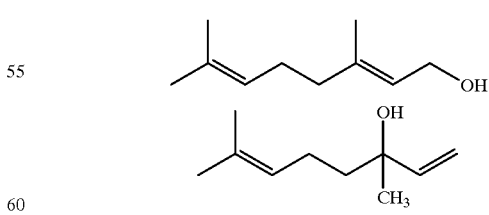

The alkali-soluble polymers mentioned for the present invention may be prepared using polymerization processes which are commonly employed in polymer chemistry. For example, an advantageous method of preparation involves heating of the prescribed monomer component in the presence of AIBN (2,2'-azobisisobutyronitrile) as a free radical initiator. Alkali-soluble polymers other than methacrylate-based polymers may also be advantageously prepared by established methods.

Methacrylate polymers are known to have high transparency in the deep ultraviolet region, and in the structure with the aforementioned resin and the added allyl alcohol compound, by appropriately selecting a structure which contains no chromophores with high extinction coefficient in the wavelength range of 190–250 nm, its combination with a suitable amount of a PAG (photoacid generator) will result in a resist with high sensitivity which can advantageously respond to light exposure using deep ultraviolet rays.

The above-mentioned alkali-soluble polymer has an alkali-soluble group which can be protected by acid catalyst reaction in the presence of an allyl alcohol compound, and the protecting reaction which can regenerate the protonic acid can therefore provide high sensitivity. Because the alkali-soluble group is protected after the protecting reaction, the exposed regions of the resist film become insoluble to basic aqueous solutions so that development can give a negative pattern by dissolution of the unexposed regions. Here, the resulting pattern has no swelling because a change in polarity in the base resin is utilized.

In the chemical amplification resist of the invention, the aforementioned PAG used in combination with the acid-sensitive polymer may be a PAG which is commonly used in resist chemistry, specifically a substance which produces a proton acid upon irradiation with ultraviolet rays, far ultraviolet rays, vacuum ultraviolet rays, X-rays and other radiation. PAGs which may be used according to the invention include, but are not limited to, the following.

(1) Onium salts:

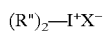

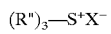

In this formula, R" represents a substituted or unsubstituted aromatic ring or alicyclic group, and X represents $BF_4$, $PF_6$, $AsF_6$, $SbF_6$, $CF_3SO_3$, $ClO_4$ and the like.

(2) Sulfonic acid esters:

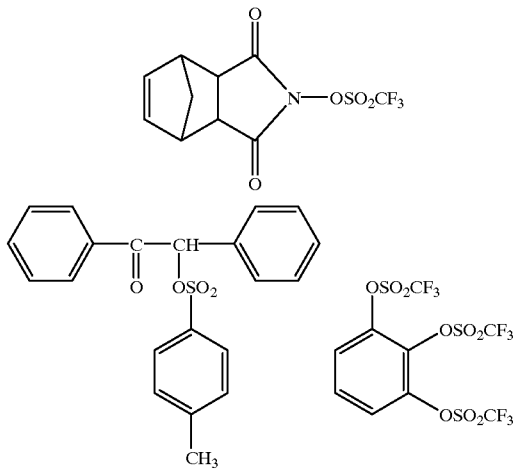

(3) Halogenated compounds:

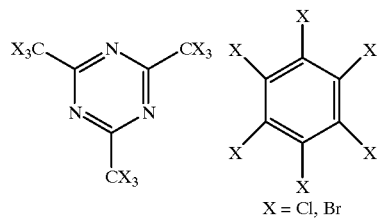

X = Cl, Br

These PAG (photoacid generator) compounds may be used in varying amounts in the resist composition of the invention. The amount of the PAG used is recommended to be 0.1–50 wt % (with respect to the polymer weight), and more preferably 1–15 wt %. However, it is preferred for the structure of the polymer and the PAG and the amount of the PAG used to be such that the absorbance at the exposure wavelength is no greater than 1.75.

The resist composition of the invention can usually be advantageously used in the form of a resist solution, prepared by dissolving the aforementioned alkali-soluble polymer, allyl alcohol compound and PAG in an appropriate organic solvent. Useful organic solvents recommended for preparation of the resist solution include ethyl lactate, methyl amyl ketone, methyl-3-methoxypropionate, ethyl-3-ethoxypropionate and propylene glycol methyl ether acetate, but there is no limitation to these. These solvents may be used alone but, if necessary, two or more of the solvents may be used in admixture. The amount of the solvent used is not particularly restricted, but it is preferably an amount sufficient to give a viscosity suitable for application by spin coating, etc. for the desired resist film thickness.

Depending on the need, an adjuvant solvent may also be used in addition to the aforementioned solvent (main solvent) in the resist solution of the invention. The auxiliary solvent may not be necessary depending on the solubility of the solutes and the coating uniformity of the solution, but for cases where the solutes have low solubility and the coating uniformity is not satisfactory, it is usually preferred to be added in the range of 1–30 wt %, and more preferably 10–20 wt %, with respect to the main solvent. Examples of useful auxiliary solvents include, but are not limited to, butyl acetate, γ-butyrolactone, propylene glycol methyl ether and the like.

The present invention also provides a process for forming resist patterns, particularly negative patterns, on target substrates using the resist composition described above. The negative resist pattern of the invention can usually be formed in the following manner.

First, the target substrate is coated with the resist composition of the invention to form a resist film. The target substrate can be a substrate which is commonly used in semiconductor devices or other devices, as examples of which there may be mentioned silicon substrates, glass substrates, non-magnetic ceramic substrates, etc. These substrates may have additional layers on their upper sides, when necessary, such as silicon oxide film layers, wiring metal layers, interlayer insulating film layers, magnetic films and the like, and various wirings or circuits may also be incorporated therein. These substrates may also be subjected to hydrophobic treatment by common methods in order to increase their adhesion with the resist film. As an example of a suitable hydrophobic treatment agent there may be mentioned 1,1,1,3,3,3-hexamethyldisilazane (HMDS).

The coating of the resist composition may be accomplished by applying it as a resist solution onto the target substrate, as described above. The resist solution may coated be spin coating, roll coating, dip coating or another common technique, but spin coating is particularly useful. The thickness of the resist film is recommended to be in the range of about 0.1–200 µm, but in the case of exposure with a KrF, ArF or other excimer laser, it is recommended to be in the range of 0.1–1.5 µm. The thickness of the formed resist film can vary widely depending on many factors, including the purpose of use.

The resist film which has been coated onto the substrate is preferably prebaked at a temperature of about 60–180° C. for about 30–120 seconds prior to its selective exposure to the image-forming radiation. The prebaking can be accomplished using a common heating means for resist processes. Examples of suitable heating means include hot plates, infrared heating ovens and microwave heating ovens.

The prebaked resist film is then selectively exposed to image-forming radiation with a common exposure apparatus. Suitable exposure apparatuses include commercially available ultraviolet (deep ultraviolet) exposure apparatuses, X-ray exposure apparatuses, electron beam exposure apparatuses, and others. The exposure conditions may be selected as deemed appropriate, and according to the invention an excimer laser (248 nm wavelength KrF laser or 193 nm wavelength ArF laser) may be advantageously used as the exposure source, as was mentioned above. Throughout the present specification, the term "radiation" will be used to mean radiation from any of these light sources.

Subjecting the exposed resist film to PEB produces a protecting reaction of the alkali-soluble group by the acid catalyst. The post exposure baking can be accomplished in the same manner as the prior prebaking, such as to allow sufficient protection reaction. For example, the baking temperature may be a temperature of about 60–180° C. and the baking carried out for about 30–120 seconds, but this will be preferably adjusted based on the pattern size and shape.

After the PEB, the resist film is developed in a basic aqueous solution as the developing solution. For the development, a common developing apparatus may be used, such as a spin developer, dip developer, spray developer or the like. The basic aqueous solution used as the developing solution may be an aqueous solution of a hydroxide of a metal belonging to Group I or II in the periodic table, such as potassium hydroxide, or an aqueous solution of an organic base containing no metal ion, such as tetraalkylammonium hydroxide; an aqueous solution of tetramethylammonium hydroxide (TMAH) is most preferred, and various additives such as surfactants may also be added for an enhanced developing effect. Development results in removal of the solution at the unexposed sections of the resist film, so that a negative resist pattern remains on the substrate only at the exposed regions.

The following examples serve as more detailed explanation regarding synthesis of the acid-sensitive polymers of the invention, preparation of resist compositions and formation of resist patterns. These are merely examples and are not intended to restrict the scope of the invention.

EXAMPLE 1

A base resin was synthesized by charging cyclohexyl methacrylate, γ-butyrolacton-2-yl methacrylate and methacrylic acid at a charging ratio of 5:2:3. The obtained resin was dissolved in PGMEA (propyleneglycol methyl ether acetate) to make a 15 wt % solution. To the solution there were also added cis-verbenol at 40 wt % with respect to the resin weight and 10 wt % of γ-butyrolactone. A 2 wt % portion of triphenylsulfonium trifluoromethanesulfonate was added to and fully dissolved in this solution. The resulting resist solution was filtered with a 0.2 µm Teflon membrane filter, and then spin coated onto a silicon substrate which had been HMDS treated, and this was prebaked at 110° C. for 60 seconds to form a 0.7-µm thick resist film. After exposing this to a KrF excimer laser stepper (NA=0.45), it was baked at 120° C. for 60 seconds, and then developed with a 2.38% tetramethylammonium hydroxide (TMAH) developing solution and rinsed with deionized water. A resolution of 0.25 µmL/S was obtained at a dose of 14.0 mJ/cm$^2$.

EXAMPLE 2

The resist solution of Example 1 was used in the same manner to form a 0.5-µm thick resist film on a silicon substrate which had been HMDS treated. After exposing this to an ArF excimer laser exposure apparatus (NA=0.55), it was baked at 120° C. for 60 seconds, and then developed with a 2.38% tetramethylammonium hydroxide (TMAH) developing solution and rinsed with deionized water. A resolution of 0.20 µmL/S was obtained at a dose of 4.2 mJ/cm$^2$.

EXAMPLE 3

The alkali-soluble polymer of Example 1 was dissolved in 15 wt % PGMEA, and then 40 wt % of 3,5,5-trimethyl-2-cyclohexene to the resin weight and 10 wt % of γ-butyrolactone were added to the solution. Also, 2 wt % of diphenyliodonium trifluoromethanesulfonate was added to the resin as a resist. This was spin coated on a silicon substrate which had been HMDS treated, and then prebaked at 110° C. for 60 seconds to form a 0.5-µm thick resist film. After exposing it to an ArF excimer laser exposure apparatus, it was baked at 130° C. for 60 seconds and then developed in a 2.38% tetramethylammonium hydroxide (TMAH) developing solution and rinsed with deionized water. A resolution of 0.18 µmL/S was obtained at a dose of 3.4 mJ/cm$^2$.

EXAMPLE 4

The alkali-soluble polymer of Example 1 was dissolved in 15 wt % PGMEA, and then 50 wt % of 3-methyl-2-cyclohexen-1-ol to the resin weight and 10 wt % of γ-butyrolactone as an adjuvant solvent were added to the solution. Also, 2 wt % of diphenyliodonium trifluoromethanesulfonate was added to the resin as a resist. This was spin coated on a silicon substrate which had been HMDS treated, and then prebaked at 110° C. for 60 seconds to form a 0.5-µm thick resist film. After exposing it to an ArF excimer laser exposure apparatus, it was baked at 120° C. for 60 seconds and then developed in a 2.38% tetramethylammonium hydroxide (TMAH) developing solution and rinsed with deionized water. A resolution of 0.18 µmL/S was obtained at a dose of 3.4 mJ/cm$^2$.

EXAMPLE 5

The alkali-soluble polymer of Example 1 was dissolved in 15 wt % PGMEA, and then 40 wt % of geraniol to the resin weight and 10 wt % of γ-butyrolactone as an adjuvant solvent were added to the solution. Also, 2 wt % of diphenyliodonium trifluoromethanesulfonate was added to the resin as a resist. This was spin coated on a silicon substrate which had been HMDS treated, and then prebaked at 110° C. for 60 seconds to form a 0.5-µm thick resist film. After exposing it to an ArF excimer laser exposure apparatus, it was baked at 130° C. for 60 seconds and then developed in a 2.38% tetramethylammonium hydroxide (TMAH) developing solution and rinsed with deionized water. A resolution of 0.20 μmL/S was obtained at a dose of 4.0 mJ/cm².

EXAMPLE 6

A base resin was synthesized by charging adamantyl methacrylate, itaconic anhydride and methacrylic acid at a charging ratio of 5:1:4. This was dissolved in PGMEA (propyleneglycol methyl ether acetate) to make a 15 wt % solution. To the solution there were also added cis-verbenol at 40 wt % with respect to the resin weight and γ-butyrolactone at 12 wt % as an adjuvant solvent. A 2 wt % portion of triphenylsulfonium trifluoromethanesulfonate was added to and fully dissolved in this solution. The resulting resist solution was filtered with a 0.2 μm Teflon membrane filter and then spin coated onto a silicon substrate which had been HMDS treated, and this was prebaked at 110° C. for 60 seconds to form a 0.5-μm thick resist film. After exposing this to an ArF excimer laser stepper (NA=0.55), it was baked at 130° C. for 60 seconds, and then developed with a 2.38% tetramethylammonium hydroxide (TMAH) developing solution and rinsed with deionized water. A resolution of 0.20 μmL/S was obtained at a dose of 4.4 mJ/cm².

EXAMPLE 7

A base resin was synthesized by charging vinylphenol and adamantyl methacrylate at a charging ratio of 8:2. This was dissolved in PGMEA (propyleneglycol methyl ether acetate) to make a 15 wt % solution. To the solution there were also added cis-verbenol at 35 wt % with respect to the resin weight and γ-butyrolactone at 10 wt % as an adjuvant solvent. A 4 wt % portion of triphenylsulfonium trifluoromethanesulfonate was added to and fully dissolved in this solution. The resulting resist solution was filtered with a 0.2 μm Teflon membrane filter and then spin coated onto a silicon substrate which had been HMDS treated, and this was prebaked at 110° C. for 60 seconds to form a 0.7-μm thick resist film. After exposing this to a KrF excimer laser stepper (NA=0.45), it was baked at 130° C. for 60 seconds, and then developed with a 2.38% tetramethylammonium hydroxide (TMAH) developing solution and rinsed with deionized water. A resolution of 0.25 μmL/S was obtained at a dose of 10.0 mJ/cm².

EXAMPLE 8

A base resin was synthesized by charging vinylphenol, maleic anhydride and cyclohexyl methacrylate at a charging ratio of 7:1:2. This was dissolved in PGMEA (propyleneglycol methyl ether acetate) to make a 15 wt % solution. To the solution there were also added cis-verbenol at 35 wt % with respect to the resin weight and γ-butyrolactone at 10 wt % as an adjuvant solvent. A 2 wt % portion of triphenylsulfonium trifluoromethanesulfonate was added to and fully dissolved in this solution. The resulting resist solution was filtered with a 0.2 μm Teflon membrane filter and then spin coated onto a silicon substrate which had been HMDS treated, and this was prebaked at 110° C. for 60 seconds to form a 0.7-μm thick resist film. After exposing this to a KrF excimer laser stepper (NA= 0.45), it was baked at 130° C. for 60 seconds, and then developed with a 2.38% tetramethylammonium hydroxide (TMAH) developing solution and rinsed with deionized water. A resolution of 0.25 μmL/S was obtained at a dose of 14.0 mJ/cm².

EXAMPLE 9

A base resin was synthesized by charging vinyl benzoate, maleimide and adamantyl methacrylate at a charging ratio of 3:2:5. This was dissolved in PGMEA (propyleneglycol methyl ether acetate) to make a 15 wt % solution. To the solution there were also added cis-verbenol at 40 wt % with respect to the resin weight and γ-butyrolactone at 10 wt % as an adjuvant solvent. A 2 wt % portion of triphenylsulfonium trifluoromethanesulfonate was added to and fully dissolved in this solution. The resulting resist solution was filtered with a 0.2 μm Teflon membrane filter and then spin coated onto a silicon substrate which had been HMDS treated, and this was prebaked at 110° C. for 60 seconds to form a 0.7-μm thick resist film. After exposing this to a KrF excimer laser stepper (NA=0.45), it was baked at 130° C. for 60 seconds, and then developed with a 2.38% tetramethylammonium hydroxide (TMAH) developing solution and rinsed with deionized water. A resolution of 0.28 μmL/S was obtained at a dose of 17.5 mJ/cm².

EXAMPLE 10
Dry Etching Resistance Comparison

The resists of Examples 1, 4, 6 and 9 were used to form resist films to 1 μm thickness on silicon substrates. The commercially available novolac resist, Nagase Positive Resist NPR-820 (product of Nagase Sangyo) and PMMA (polymethyl methacrylate) were used for comparison, and etching was performed for 5 minutes with a parallel plate RIE apparatus under conditions of $P\mu=200$ W, pressure=0.02 Torr and $CF_4$ gas=100 sccm, upon which the amounts of film loss of the samples were compared.

| Resist | Etching rate (Å/min) | Rate ratio |
| --- | --- | --- |
| NPR-820 | 530 | 1 |
| PMMA | 805 | 1.52 |
| Example 1 | 678 | 1.28 |
| Example 4 | 700 | 1.32 |
| Example 6 | 562 | 1.06 |
| Example 9 | 600 | 1.03 |

These results demonstrated that the etching resistance of the resists according to the invention was close to that of the novolac resist NPR-802, while the resist of Example 6 which is also suitable for ArF exposure exhibited about equal resistance. The resist of Example 9 which is suitable for KrF exhibited resistance which compared favorably to that of the novolac. This experiment also confirmed that all of the resists were much more excellent than PMMA.

By using a resist composition according to the invention it is possible to form an intricate negative resist pattern with a practical degree of sensitivity and with no swelling.

In addition, control of the alkali solubility is facilitated when the alkali-soluble polymer of the resist composition is in the form of a terpolymer including a strong alkali-soluble group in the first monomer unit and a weak alkali-soluble group in the second monomer unit, while addition of an allyl alcohol-based compound which can protect the alkali-soluble groups allows an acid catalyst reaction to be used, to achieve higher sensitivity than with conventional resist compositions.

Moreover, because the resist composition of the invention forms a pattern based on polarity changes rather than the conventional crosslinking, it is possible to easily achieve high contrast and resolution. When a polycyclic alicyclic compound structure is included in the third monomer unit, and especially when it has an adamantyl structure, the RIE resistance is higher and the transparency is also higher in the deep ultraviolet region, so that novel, high sensitivity negative resists can be provided which are suitable even for extremely short wavelength exposure light sources such as ArF excimer lasers.

We claim:

1. A negative-type resist composition developable in a basic aqueous solution, which comprises a film-formable, basic aqueous solution-soluble polymer with an alkali-soluble group, a compound with an allyl alcohol structure and a photoacid generator which upon decomposition by absorption of image-forming radiation causes said compound with an allyl alcohol structure to become a protecting group for said alkali-soluble group.

2. A resist composition according to claim 1, wherein said alkali-soluble polymer includes at least one unit derived from compounds selected from the group consisting of acrylic acid, methacrylic acid, itaconic acid, vinyl benzoate or bicyclo[2.2.1]hepto-5-en-2-carboxylic acid, vinylphenol, styrene and their derivatives.

3. A resist composition according to claim 1, wherein said alkali-soluble polymer includes one or more weak alkali-soluble groups selected from the group consisting of lactone rings, imide rings and acid anhydrides.

4. A resist composition according to claim 1, wherein said alkali-soluble polymer includes an alicyclic hydrocarbon portion or a polycyclic alicyclic hydrocarbon portion.

5. A resist composition according to claim 4, wherein said polycyclic alicyclic hydrocarbon portion includes a structure comprising one member selected from among adamantyl groups, norbornyl groups and bicyclo[2.2.2]octyl groups.

6. A resist composition according to claim 5, wherein said polycyclic alicyclic hydrocarbon portion includes at least one hydroxyl group or ketone group, or both.

7. A resist composition according to claim 1, wherein said compound with an allyl alcohol structure includes a structure represented by the following formula (I) or (II):

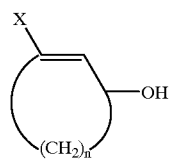

(I)

wherein X represents a hydrogen atom or a linear, branched or cyclic alkyl group which may itself have an additional allyl alcohol structure, and n represents an integer of 2–7;

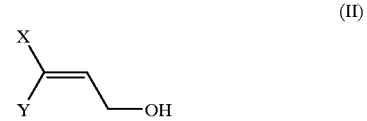

(II)

wherein X is as defined above, and Y represents a linear, branched or cyclic alkyl group with at least two carbon atoms, which may itself have an additional allyl alcohol structure, and which may also have another substituent.

8. A resist composition according to claim 7, wherein said compound with an allyl alcohol structure includes an alicyclic structure or polycyclic alicyclic structure.

9. A resist composition according to claim 1, wherein said compound with an allyl alcohol structure includes at least one hydroxyl group, ketone group or alkyl oxycarbonyl group in addition to the allyl alcohol moiety.

10. A resist composition according to claim 1, which has an absorbance of 1.75 or lower at the wavelength of the image-forming radiation exposure light source.

11. A resist composition according to claim 1, which includes at least one solvent selected from the group consisting of ethyl lactate, methyl amyl ketone, methyl-3-methoxypropionate, ethyl-3-ethoxypropionate and propylene glycol methyl ether acetate.

12. A resist composition according to claim 11, which further includes a solvent selected from the group consisting of butyl acetate, γ-butyrolactone and propylene glycol methyl ether.

13. A process for forming a resist pattern, comprising the steps of coating a target substrate with a resist composition according to claim 1, selectively exposing the formed resist film to image-forming radiation capable of inducing decomposition of the photoacid generator in said resist composition, and developing the exposed resist film with a basic aqueous solution.

* * * * *